United States Patent
Funakoshi

(10) Patent No.: US 8,041,443 B2
(45) Date of Patent: Oct. 18, 2011

(54) SURFACE DEFECT DATA DISPLAY AND MANAGEMENT SYSTEM AND A METHOD OF DISPLAYING AND MANAGING A SURFACE DEFECT DATA

(75) Inventor: Tomohiro Funakoshi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 342 days.

(21) Appl. No.: 12/469,762

(22) Filed: May 21, 2009

(65) Prior Publication Data

US 2009/0292387 A1 Nov. 26, 2009

(30) Foreign Application Priority Data

May 21, 2008 (JP) ................................. 2008-132666

(51) Int. Cl.
*G06F 19/00* (2011.01)
*G06F 11/30* (2006.01)
*G21C 17/00* (2006.01)
*G01N 21/00* (2006.01)
*G06K 9/00* (2006.01)

(52) U.S. Cl. .......... 700/110; 700/108; 700/109; 70/180; 70/185; 356/237.3; 356/237.4; 356/239.3; 382/141; 382/145; 382/149

(58) Field of Classification Search .......... 700/108–110; 702/180, 185; 356/237.3, 237.4, 239.3; 382/141, 382/144–145, 149
See application file for complete search history.

(56) References Cited

U.S. PATENT DOCUMENTS

| | | | |
|---|---|---|---|
| 7,113,628 B1 * | 9/2006 | Obara et al. .................. 382/149 |
| 7,116,816 B2 * | 10/2006 | Tanaka et al. ................. 382/149 |
| 7,231,079 B2 * | 6/2007 | Okuda et al. .................. 382/145 |
| 7,283,659 B1 * | 10/2007 | Bakker et al. ................. 382/149 |
| 7,394,534 B1 * | 7/2008 | Huet et al. .................... 356/237.4 |
| 7,606,409 B2 * | 10/2009 | Funakoshi .................... 382/141 |
| 7,760,347 B2 * | 7/2010 | Nehmadi et al. ............. 356/237.4 |
| 7,764,826 B2 * | 7/2010 | Miyamoto et al. ............ 382/149 |
| 7,885,789 B2 * | 2/2011 | Funakoshi .................... 702/180 |
| 2006/0111879 A1 | 5/2006 | Funakoshi |
| 2006/0269120 A1 | 11/2006 | Nehmadi et al. |
| 2007/0031026 A1 | 2/2007 | Kurihara et al. |
| 2007/0105245 A1 * | 5/2007 | Funakoshi et al. ............. 438/14 |
| 2007/0145270 A1 | 6/2007 | Miyamoto et al. |
| 2008/0226153 A1 * | 9/2008 | Ono et al. ..................... 382/141 |
| 2008/0226158 A1 | 9/2008 | Abe et al. |
| 2008/0298669 A1 * | 12/2008 | Funakoshi et al. ............ 382/145 |
| 2009/0180109 A1 * | 7/2009 | Ikota et al. ................. 356/239.3 |

FOREIGN PATENT DOCUMENTS

| | | |
|---|---|---|
| JP | 2006-173589 A | 6/2006 |
| JP | 2007-17290 A | 1/2007 |
| JP | 2007-40910 A | 2/2007 |
| JP | 2007-184565 A | 7/2007 |
| JP | 2008-227028 A | 9/2008 |

* cited by examiner

*Primary Examiner* — Ramesh Patel
(74) *Attorney, Agent, or Firm* — Miles & Stockbridge P.C.

(57) ABSTRACT

A surface defect data display and management system comprises a risk score calculation unit for calculating the magnitude of an influence a surface defect on a wafer detected by a wafer inspection system or review system has upon a reduction in the yield of a final product as a risk score of the surface defect based on a defect size of the surface defect on the wafer and a pattern concentration obtained from design data of a pattern figure nearby a location corresponding to the position of the surface defect, and a correlation graph and defect image display unit for preparing a correlation graph showing the correlation between the defect size and the risk score of each defect, displaying the prepared correlation graph on the display apparatus and displaying additionally a defect image list of one or more defects selected by using the correlation graph.

11 Claims, 13 Drawing Sheets

FIG.3

(DEFECT DATA) ~350

| | | |
|---|---|---|
| PRODUCT NAME | HX2345 | |
| INSPECTION STEP NAME | K0031 | 351 HEADER DATA |
| LOT ID | L080414112 | |
| WAFER ID | W005 | |
| DIE LAYOUT | 1207 | |

| DEFECT ID | DEFECT COORDINATE | MAXIMUM GRAY LEVEL DIFFERENCE | DEFECT SIZE | DEFECT CATEGORY | DEFECT IMAGE DATA |
|---|---|---|---|---|---|
| 1 | $x_1, y_1$ | $d_1$ | $s_1$ | $c_1$ | JPEG$_1$ |
| 2 | $x_2, y_2$ | $d_2$ | $s_2$ | $c_2$ | JPEG$_2$ |
| ... | ... | ... | ... | ... | ... |
| n | $x_n, y_n$ | $d_n$ | $s_n$ | $c_n$ | JPEG$_n$ |

352 DETAIL DEFECT INFORMATION RECORD

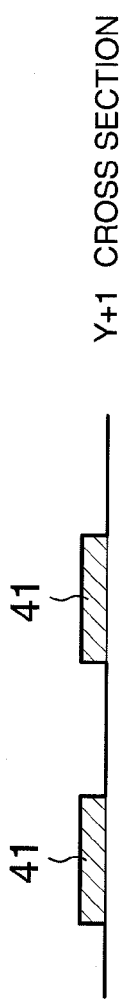
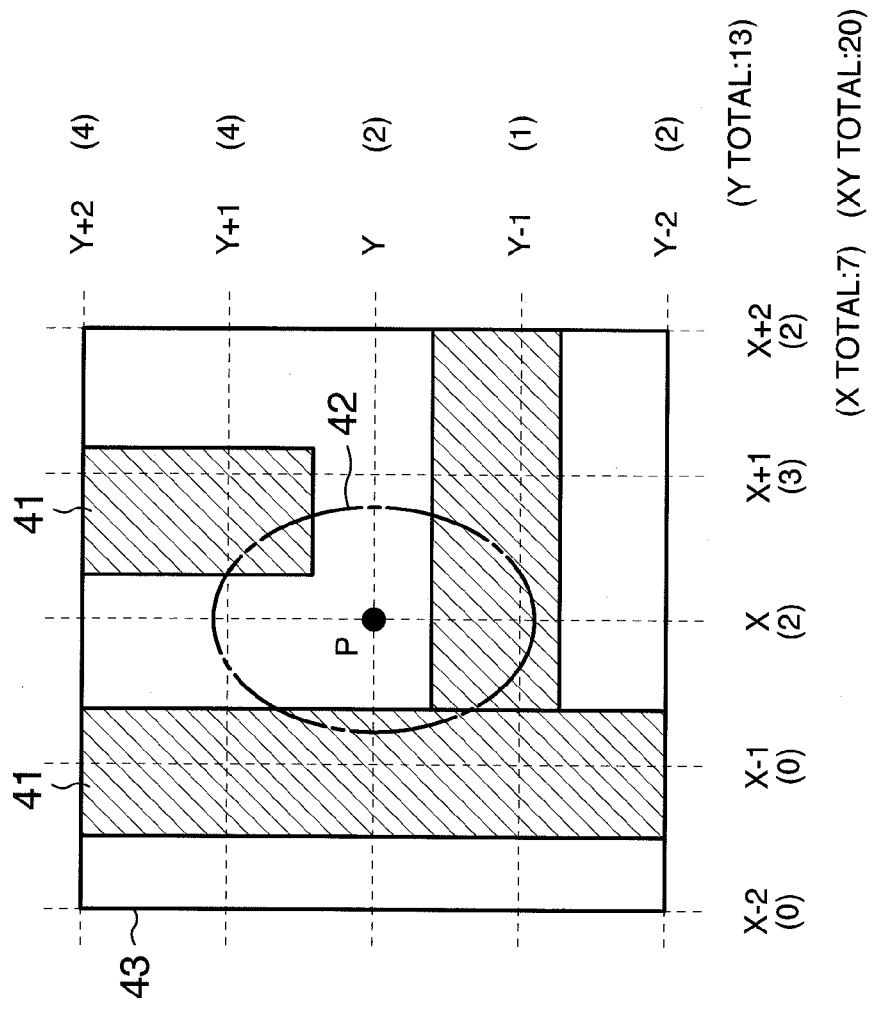
FIG.5A
FIG.5B

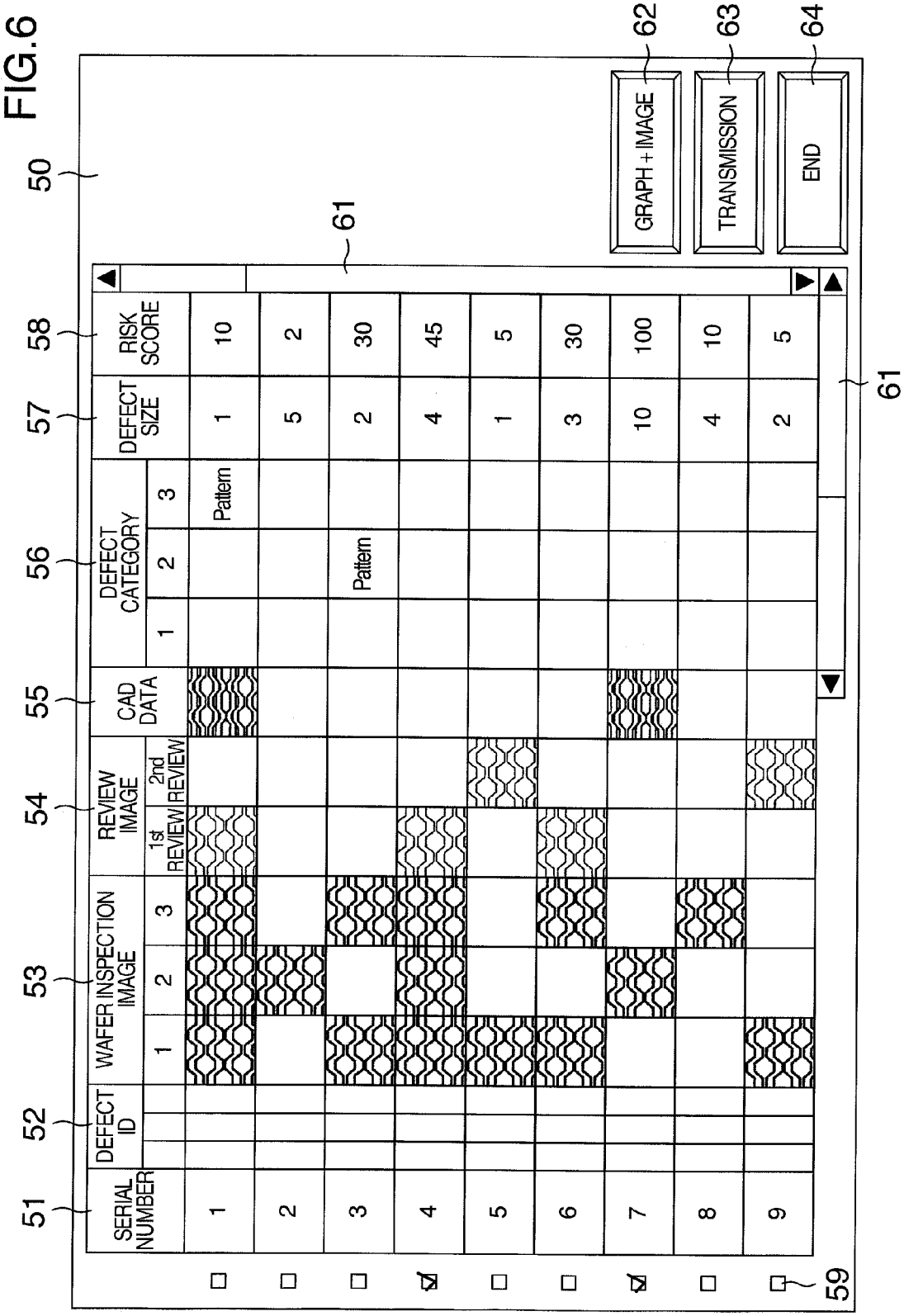

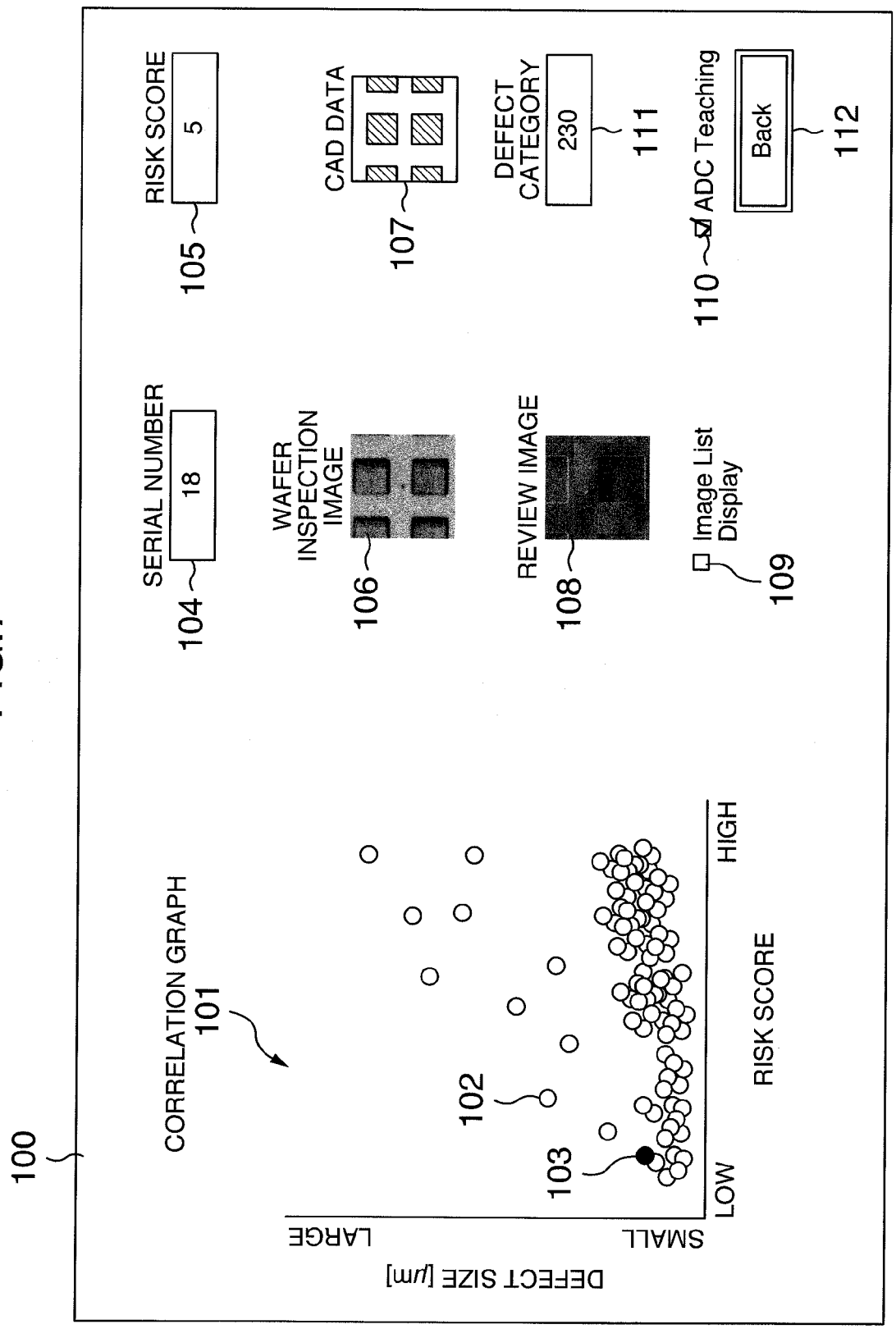

SURFACE DEFECT DATA DISPLAY AND MANAGEMENT SYSTEM AND A METHOD OF DISPLAYING AND MANAGING A SURFACE DEFECT DATA

BACKGROUND OF THE INVENTION

The present invention relates to a surface defect data display and management system for managing data concerning defects of a pattern formed on the surface of a planar substrate such as a semiconductor wafer and a method of displaying and managing surface defect data.

Foreign matters on the surface of a wafer and defects of a circuit pattern as well which take place in the semiconductor production steps are responsible for causes of a faulty semiconductor product such as an integrated circuit manufactured from the semiconductor wafer. Accordingly, in the semiconductor production line, the foreign matters on the wafer surface and circuit pattern defects (hereinafter referred to as "surface defects" or simply "defects") are detected and besides, the defect occurrence condition is quantified with a view to constantly monitoring the condition of the production steps. Further, it has also been practice to confirm whether or not the surface defect has a fatal influence upon the semiconductor product by observing the shape or contour of the surface defect in detail.

The work of observing the surface defect has hitherto been carried out with the help of human eye but lately, through techniques of automatic defect review (ADR) and automatic defect classification (ADC) using the computer aided image processing technique, the defect size, shape and kind have been able to be decided automatically (see JP2007-040910A1 and JP2007-184565A1, for example).

Thanks to the automatic function as above, a large amount of defect data can be acquired within a short period of time and consequently, causes of surface defect to be searched can be narrowed down efficiently. But when the wafer surface defect is much more fatal so as to largely affect the production yield of a final product such as an integrated circuit, the final confirmation of the surface defect cannot help relying on the human eye. Accordingly, the frequency by which the engineer or operator observes defects with a review system or has another look at images the review system has automatically captured is not always reduced.

On the other hand, in the review system, the performance such as sensitivity of a detector has been improved and various functions have been becoming sophisticated. Therefore, the load imposed on the engineer or operator engaged in operation of the review system rather increases. For mitigation of the load, an example of an expedient which manages to realize improvements in operability of operations ranging from the defect observation to the image collation and carried out reiteratively in defect analysis by contriving the graphical user interface (GUI) is disclosed in JP 2006-173589A1, for example.

SUMMARY OF THE INVENTION

When a great deal of surface defect data pieces are outputted by the ADR and ADC, there arises a large problem as to how surface defects to be observed visually by the operator are to be selected. To cope with this problem, the aforementioned JP2006-173589A1, for example, shows an example in which a surface defect to be observed visually is selected on the basis of a feature factor characteristic of the defect such as a defect size. In the Patent Document, a GUI is provided which can easily select a surface defect of a large defect size and therefore, the operator can select a surface defect having a desired feature factor by using the GUI to observe its image.

Even with the large-sized surface defect in mind, however, when it lies at a portion where a circuit pattern is thin, this surface defect will not sometimes have an influence upon the operation of an integrated circuit ultimately formed on the wafer whereas even with a small-sized surface defect in mind, when it lies at a portion where a circuit pattern is thick, this surface defect will sometimes give a fatal fault to the operation of an integrated circuit. Therefore, it should be considered that for selection of the surface defect to be observed visually by the operator, the preferential selection be made of a surface defect which gives a fatal fault to the operation of the integrated circuit, and it is not always preferable to select a large-sized surface defect.

Accordingly, an object of the present invention is to provide a surface defect data display and management system which can enable the operator to operationally easily select, from a great deal of data representative of surface defects present on a planar substrate (such as a wafer) detected through detection by means of an appearance inspection system, surface defect data of a surface defect having the possibility of fatally influencing the operation of, for example, an integrated circuit formed on the planar substrate and which can display an image of the defect contained in the selected surface defect data, and to provide a method of displaying and managing the surface defect data.

To accomplish the above object, in a surface defect data display and management system according to the present invention, on the basis of a feature factor of a surface defect on a planar substrate (for example, a defect size) detected by a surface defect inspection system such as a wafer inspection system and a concentration of a pattern obtained from design data of a pattern figure nearby a location corresponding to the position of the surface defect, the degree of an influence the surface defect has upon a yield of a final product is calculated as a risk score. Then, a correlation graph showing a correlation between feature factor and risk score of individual surface defects is prepared, the prepared correlation graph is displayed on a display apparatus and besides, for one or more surface defects selected through the use of the correlation graph, a list of defect images of the surface defects is displayed on the display apparatus.

In the correlation graph showing the correlation between feature factor and risk score and displayed on the display apparatus, individual surface defects are displayed in the form of dots at positions corresponding to sets of feature factor and risk score. Accordingly, by using the correlation graph, the operator can select a surface defect of high risk score with ease.

According to the present invention, a surface defect data display and management system and a method of displaying and managing surface defect data are provided in which the operator can operationally easily select, from many pieces of surface defect data on a planar substrate which are detected by a wafer inspection system, for example, surface defect data of a surface defect having the possibility of fatally influencing the operation of, for example, an integrated circuit formed on the planar substrate and an image of the defect contained in the selected surface defect data can be displayed.

Other objects, features and advantages of the invention will become apparent from the following description of the embodiments of the invention taken in conjunction with the accompanying drawings.

BRIEF DESCRIPTION OF THE DRAWINGS

FIG. 3 is a table showing an example of the structure of defect data stored in a defect data memory unit.

FIG. 5A is a cross-sectional diagram of an example of a wiring layer formed on a wafer.

FIG. 5B is a plan view showing a plane pattern of the wiring layer.

FIG. 6 is a diagram showing an example of a display screen displaying a list of defect data and risk score data.

FIG. 7 is a diagram showing an example of a display screen on which a correlation graph between the defect size and the risk score and an image of a defect selected through the correlation graph are displayed.

DETAILED DESCRIPTION OF THE EMBODIMENTS

Embodiments of the invention will now be described in greater detail by making reference to the accompanying drawings as necessary.

Figure 1:
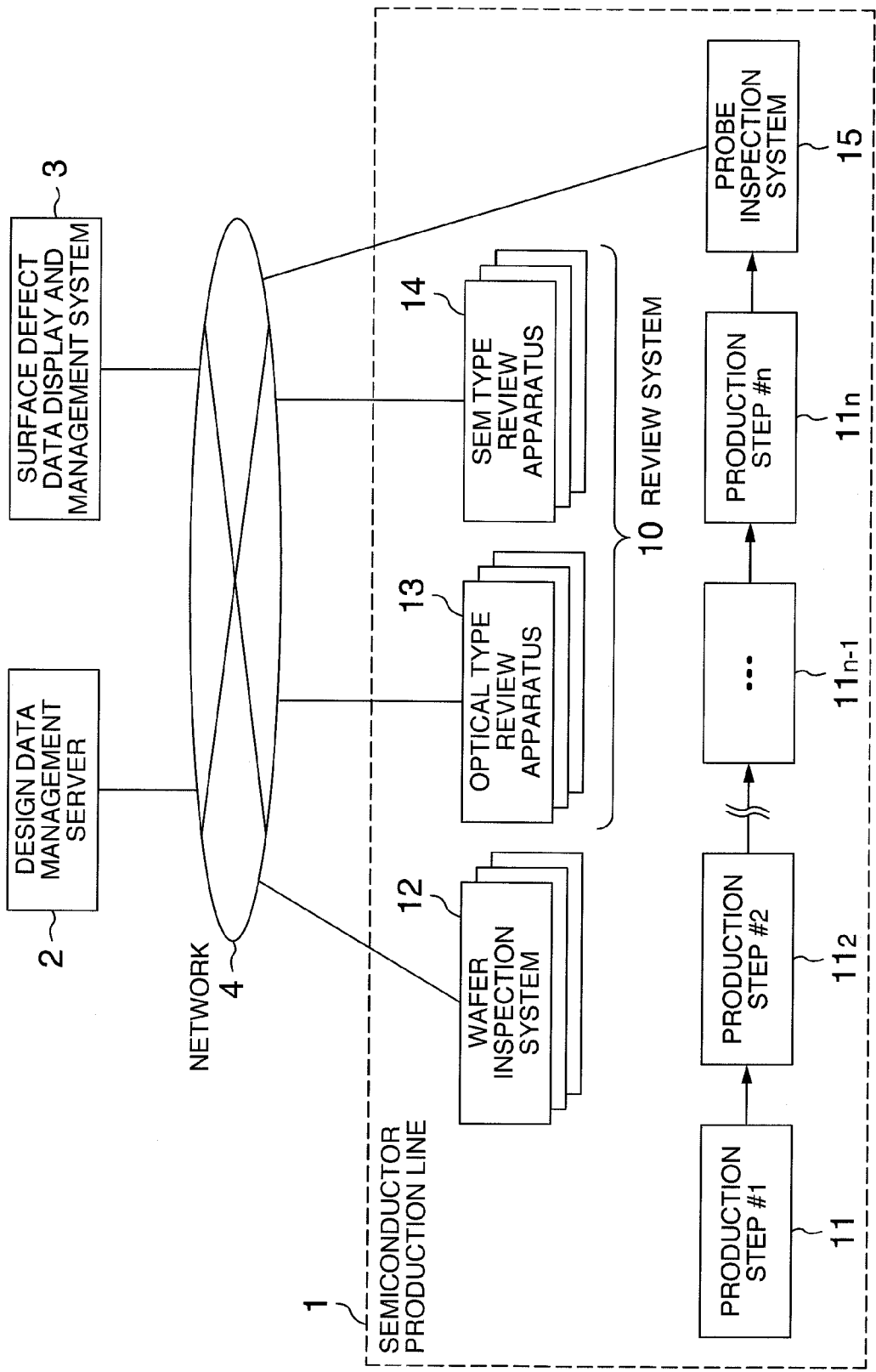
FIG. 1 is a schematic block diagram showing an example of construction of an overall system to which a surface defect data display and management system according to an embodiment of the present invention is applied.

Referring first to FIG. 1, there is illustrated an example of construction of an overall system to which a surface defect data display and management system according to an embodiment of the invention is applied.

As shown in FIG. 1, a semiconductor production line 1 is comprised of a plurality of production steps 11 executable in a so-called clean room and through the plural production steps 11, circuit patterns of devices and wiring are formed sequentially on, for example, a silicon wafer to manufacture an integrated circuit on the wafer. At that time, in a final one of the production steps 11, a probe inspection system 15 is provided, so that the integrated circuit formed on the wafer is inspected electrically to obtain quality information such as production yield.

In correspondence with the individual production steps 11, a wafer inspection system 12, an optical review apparatus 13, an SEM review apparatus 14 are provided as necessary, the optical review apparatus 13 and SEM review apparatus 14 being generally termed "a review system 10" hereinafter.

The wafer inspection system 12 inspects foreign matters and surface defects (hereinafter, generally termed "defects") taking place in the individual production steps 11 to output information such as the total number of detected defects and a distribution of their positions and is used for managing the quality status of the production steps 11. Further, in respect of defects detected by the function of the ADR and real time defect classification (RDC), the wafer inspection system 12 acquires defect data including data of defect position, feature factor (such as defect size), category (defect kind) and defect image as much as possible.

In the event that the result of inspection by the wafer inspection system 12 does not indicate a good quality status of the production step 11, the defect detected by the wafer inspection system 12 is observed in greater detail by means of the review system 10. In this case, the review system 10 acquires defect data similar to those by the wafer inspection system through the function of ADR and ADC but in the course of the data acquisition, often has another look of the recipe or makes a readjustment of parameters.

A design data management server 2 cumulates and manages design data such as a circuit pattern of an integrated circuit formed on the wafer and in response to a request, offers the design data to the surface defect data display and management system 3 as necessary.

The surface defect data display and management system 3 is coupled to the wafer inspection system 12, review system 10 and probe inspection system 15 through a network 4 comprised of a LAN (Local Area Network) to capture, from the wafer inspection system 12 and review system 10, defect data of the wafer proceeding on the production steps 11 and cumulates the defect data in a memory unit not shown to manage it. The surface defect data display and management system 3 is also coupled to the design data management server 2 through the network 4 and acquires design data such as a circuit pattern from the design data management server 2 as necessary.

Next, by making reference to FIG. 2, details of construction and function of the surface defect data display and management system 3 in the present embodiment will be described. Illustrated in FIG. 2 is an example of the configuration of functional blocks of the surface defect display and management system 3.

Figure 2:
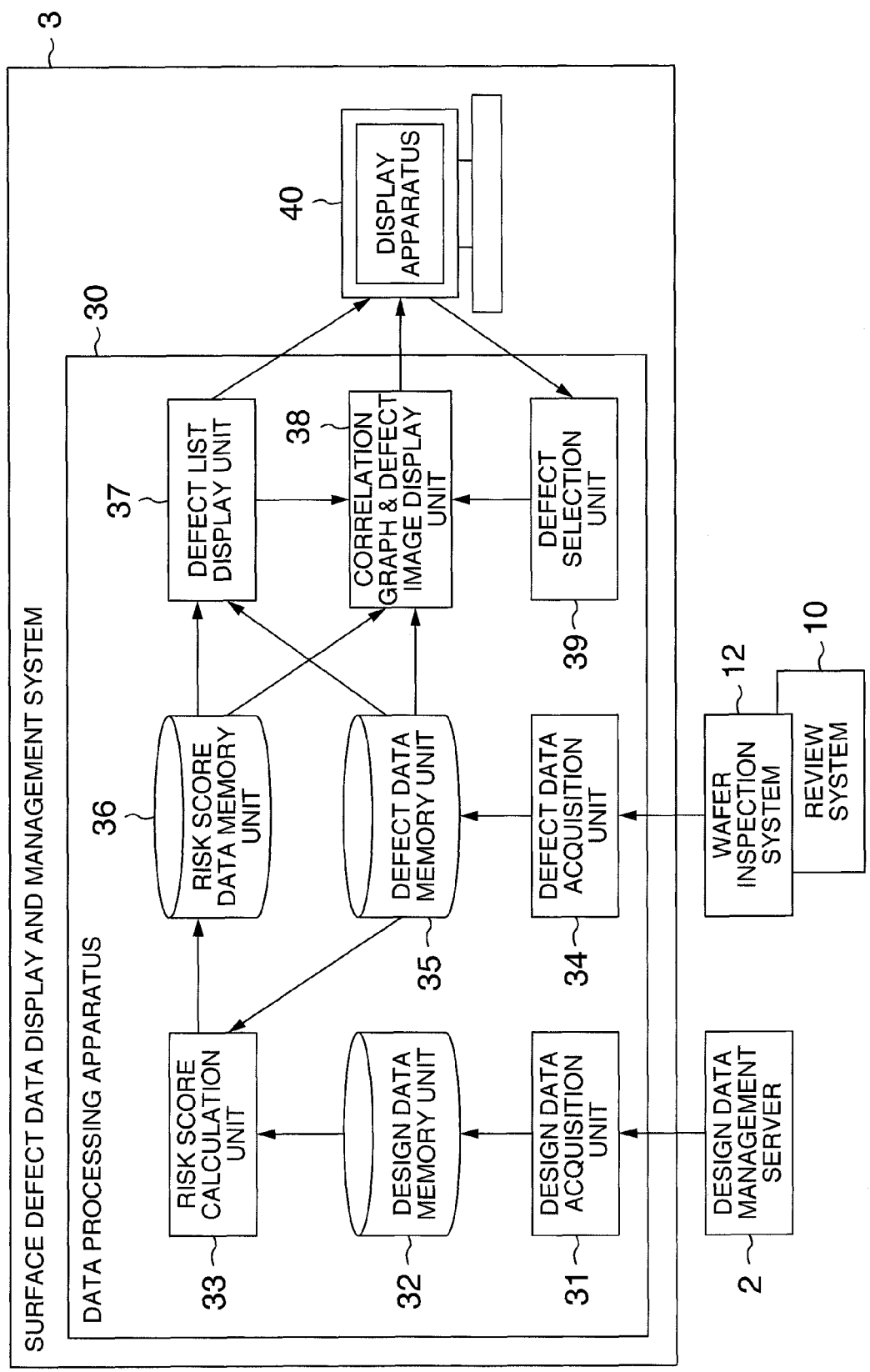
FIG. 2 is a diagram showing an example of configuration of functional blocks of the surface defect data display and management system in the present embodiment.

As shown in FIG. 2, the surface defect data display and management system 3 is constructed by connecting a display apparatus 40 to a general data processing apparatus 30. Here, the data processing apparatus 30 includes a CPU (central processing unit) and a storage comprised of a RAM (random access memory), a flush memory and a hard disc unit, these components being not shown in terms of functional blocks. The display apparatus 40 includes an input unit such as a mouse or keyboard in addition to a display unit constructed of, for example, a LCD (liquid crystal display).

The data processing apparatus 30 includes functional blocks such as a design data acquisition unit 31, a design data memory unit 32, a risk score calculation unit 33, a defect data acquisition unit 34, a defect data memory unit 35, a risk score data memory unit 36, a defect list display unit 37, a correlation graph and defect image display unit 38 and a defect selection unit 39. Functions of these functional blocks can be realized when the CPU included in the data processing apparatus 30 executes predetermined programs stored in the storage.

In FIG. 2, the design data acquisition unit 31 acquires, from the design data management server 2, design data such as a circuit pattern of an integrated circuit manufactured from a wafer representing a target or objective of defect analysis and stores the acquired design data in the design data memory unit 32. More particularly, when the design data acquisition unit 31 transmits to the data management server 2 a product name of the integrated circuit representing the defect analysis target the operator inputs and then design data having the product name responsive thereto is issued from the design data management server 2, the design data acquisition unit 31 receives the issued design data and stores it in the design data memory unit 32. The defect data acquisition unit 34 acquires, from the wafer inspection system 12 and review system 10, defect data including position, feature factor, category and defect image of the defect and stores the captured defect data in the defect data memory unit 35.

The risk score calculation unit 33 calculates, on the basis of the defect data acquired from the wafer inspection system 12 and review system 10 and stored in the defect data memory unit 35 and the design data stored in the design data memory unit 32 as well, a risk score of the defect included in the defect data and stores the calculated risk score in the risk score data memory unit 36. The risk score referred to herein is calculated defect by defect and has a numerical value indicative of the magnitude of an influence each defect has upon the function of a final product manufactured from the wafer (for example, integrated circuit). In general, the larger the defect size, the larger the risk score becomes and the larger the concentration of a pattern formed at a portion of interest, the larger the risk score becomes. An explanation will given of the definition of the risk score later.

The defect list display unit 37 designates defect data of a display target such as inspection step, lot ID and wafer ID to acquire the corresponding defect data and risk score data from the defect data memory unit 35 and risk score data memory unit 36 and displays the acquired defect data and risk score data on the display apparatus 40. Examples of display on the display apparatus 40 by means of the defect list display unit 37 will be described later with reference to the drawings.

The correlation graph and defect image display unit 38 prepares a correlation graph between risk score and feature factor (defect size or the like) of each defect in respect of defects displayed in the list table by means of the defect list display unit 37 and displays on the display apparatus 40 the thus prepared correlation graph and besides an image of a defect selected by the defect selection unit 39. Examples of display on the display apparatus 40 by means of the correlation graph and defect image display unit 38 will be described later with reference to the drawings.

In the display screen displayed on the display apparatus 40 by the defect list display unit 37 or correlation graph and defect image display unit 38, the defect selection unit 39 selects, responsive to a click or area designation information inputted by the operator, defects to be displayed as defect images individually or in a grouped fashion.

The surface defect data display and management system 3 shown in FIG. 2 has been described as including the design data acquisition unit 31, design data memory unit 32 and risk score calculation unit 33 but these functional blocks may not be included in the surface defect data display and management system 3 but may alternatively be included in the design data management server 2 or in another computer coupled to the network 4.

Figure 4:
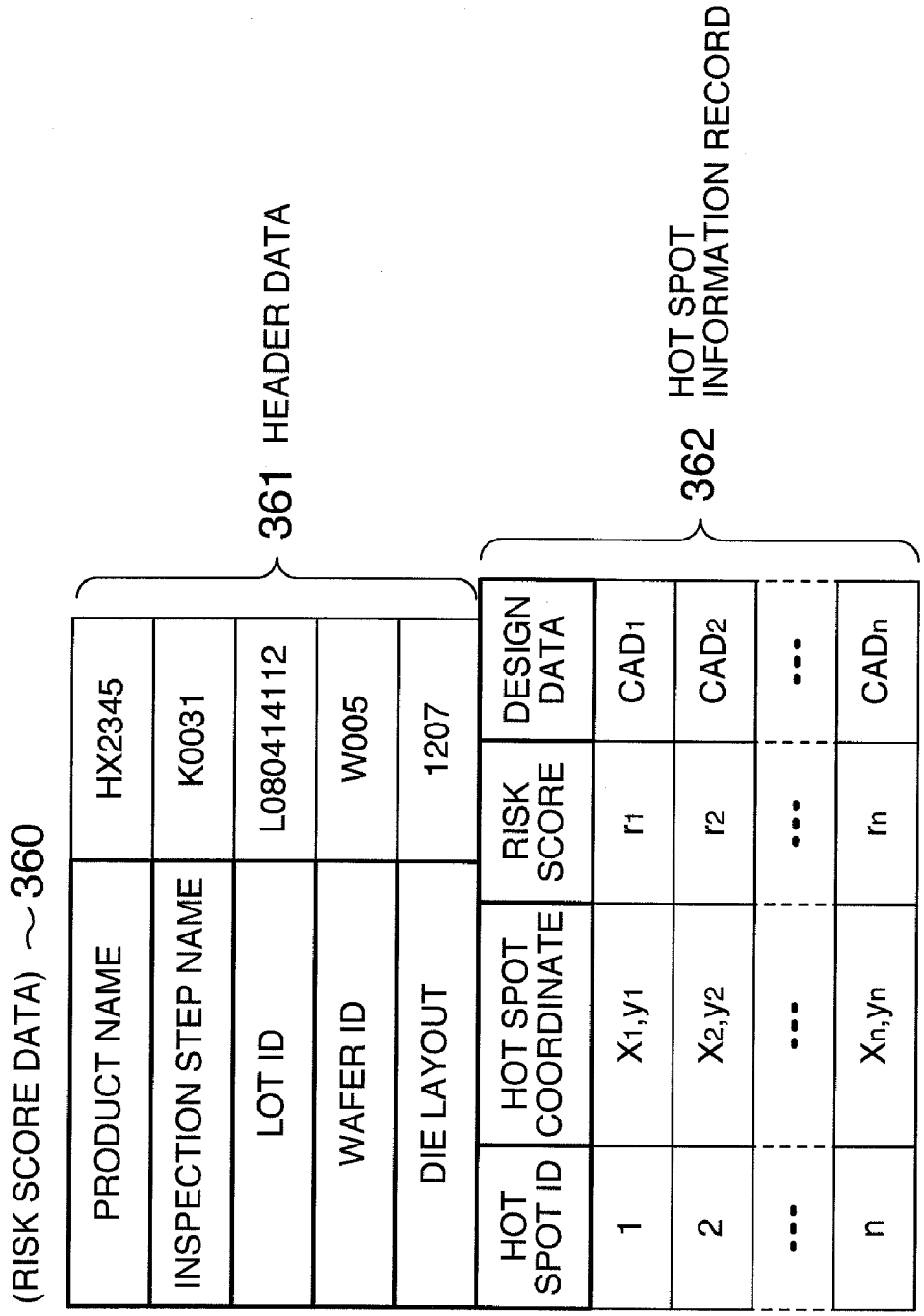
FIG. 4 is a table showing an example of the structure of risk score data stored in a risk score data memory unit.

Referring now to FIGS. 3 and 4, the structure of defect data and that of risk score data will be described. Illustrated in FIG. 3 is an example of the structure of the defect data to be stored in the defect data memory unit 35 and in FIG. 4 is an example of the structure of risk score data to be stored in the risk score data memory unit 36.

As shown in FIG. 3, defect data 350 to be stored in the defect data memory unit 35 is so structured as to include header data 351 itemized by data of product name, inspection step name, lot ID, wafer ID and die layout and to include a record 352 of pieces of detail detection information which is itemized as illustrated by data of defect ID, defect coordinate, maximum gray level difference, defect size, defect category and defect image data. Since each piece of detail detection information in the detail defect information record 352 corresponds to each detected defect, the number of the detail defect information pieces typically equals the number of defects (for example, n).

In the header data 351, the inspection step name is information for discriminating the production steps 11, the lot ID and wafer ID are information for discriminating wafers representing inspection targets one by one and the die layout is information for discriminating positions of dies in the wafer. Generally, the product name of an integrated circuit formed on the wafer is often tied with at least one of the lot ID and the wafer ID under the control of production management information managed separately but here the thus tied product name is explicitly included in the header data 351.

In the detail detection information record 352, the defect ID is information for individually discriminating defects contained in a die on a wafer designated by the header data 351 and the defect coordinate $(x_i, y_i)$ is information for indicating the center position of a defect in terms of a coordinate system provided for each die. The maximum gray level difference $(d_i)$ indicates the difference between the maximum brightness and the minimum brightness in a defect image, the defect size $(s_i)$ indicates a size of the defect, the defect category $(c_i)$ indicates the kind of defect classified through the RDC or SDC function and the defect image data $(JPEG_i)$ indicates defect image data $(CAD_i)$ obtained through the ADR function.

The defect data 350 structured as above is expressed in terms of text data excepting a portion of defect image data $(JPEG_i)$ which is expressed by, for example, JPEG (Joint Photographic Experts Group) data.

Generally, even for an inspection target at the same die on the same wafer, a defect will be detected differently when it is detected with a different wafer inspection system 12 and a different review system 10. Accordingly, different pieces of defect data 350 are acquired each time that an inspection is carried out. Further, even in individual inspections with the same wafer inspection system 12, when inspection conditions (for example, the intensity of illumination light or electron beam, the sensitivity of detector and the like) are different, different pieces of defect data 350 are acquired individually. Consequently, a plurality of pieces of defect data 350 are usually obtained for the same inspection step, the same wafer and the same die.

In such an event, for the purpose of making the pieces of defect data 350 discriminative in accordance with the inspection system and the inspection condition, the numbering rule, for example, of designating branching numbers to the inspection step name may be adopted to make the inspection system and inspection condition discriminative by the branching numbers.

As described above, when a plurality of inspections are applied to the same inspection target (the same die on the same wafer) and a plurality of pieces of defect data 350 are acquired, different defect ID's are allotted even to a physically identical defect in accordance with the individual inspections and then different defect sizes and different defect categories are acquired. Accordingly, in such an event, it is necessary that two defects respectively belonging to the plural pieces of defect data 350 be identified as the physically same defect.

In identifying the two defects as being the physically same defect, defect coordinates of the respective defects are compared with each other to decide whether the respective defect coordinates are identical and when these defect coordinates are determined to be identical (inclusive of the case when the defect coordinates are deemed to be identical), the two defects are identified as being physically identical.

Turning to FIG. 4, the risk score data 360 is so structured as to include header data 361 identically structured as the header data 351 in the defect data 350 and a record 362 of a plurality of pieces of hot spot information each having data itemized by hot spot ID, hot spot coordinate, risk score and design data.

In the hot spot information record 362, the hot spot ID is information for discriminating hot spots. Typically, a defect impersonates a hot spot and therefore, when preparing one of risk score data 360 such that it corresponds to one of defect data 350, the hot spot ID is the same as the defect ID in the defect data 350. But when a plurality of inspections are applied to the same inspection target to acquire a plurality of pieces of defect data 350 and so the risk score data 360 is prepared for a merged defect obtained while identifying defects contained in the plural pieces of defect data 350, the defect ID will not always be identical to the hot spot ID.

Accordingly, in order to identify data being of the same defect between the detail defect information record 352 and the hot spot information record 362, it is generally necessary to compare a defect coordinate with a hot spot coordinate contained in the respective records and confirm that these coordinates are the same.

Next, in case a defect is present at a hot spot coordinate position in the hot spot information record 362, the risk score in the record 362 gives a numerical value indicative of the magnitude of an influence the defect has upon the function of the integrated circuit. In the present embodiment, it is assumed that the risk score is a value calculated from defect size×pattern concentration. Here, the defect size is a defect size (s) contained in the corresponding defect record and the pattern concentration is a value calculated from the design data. The risk score defined as above is a value simply for comparison and is not a value meaning a ratio such as a percentage. A method of calculating the pattern concentration will be described later.

Further, in the hot spot information record 362, the design data is pattern figure data representative of a circuit pattern (typically, mask pattern) of, for example, a wiring layer (generally termed a layer) impersonating an inspection target in the inspection step of the integrated circuit formed on the wafer and it is assumed that the design data is pattern figure data confined in an area substantially equal to that occupied by the defect image data contained in the corresponding detail defect information record 352.

The design data indicative of the pattern figure data as above is often prepared by using a layout CAD (computer aided design) tool and so, also termed CAD data. In this type of design data, the data format may be any one provided that it can express pattern figures but in general, a so-called GDSII format or OASIS (Organization for the Advancement of Structured Information Standards) format is used in many applications.

Turning to FIGS. 5A and 5B (also, with reference to FIGS. 2 to 4), an example of a method of calculating the pattern concentration and risk score in the risk score calculation unit 33 will now be described. Exemplarily, the wiring layer formed on the wafer is illustrated in cross-sectional form in FIG. 5A and its pattern figure is illustrated in plan view form in FIG. 5B.

With reference to FIGS. 5A and 5B, hatched portions 41 show in FIG. 5A a sectional shape of a wiring layer made of an electrically conductive material such as aluminum and in FIG. 5B a plan shape of the wiring layer. In FIG. 5B, a point P indicates the center of a defect which assumptively extends over an area 42 surrounded by chained line. Then, coordinate (X, Y) of the point P provides data which is obtained as defect coordinate ($x_i$, $y_i$) in the detail defect information record 352 (see FIG. 3) and the defect size ($s_i$) can also be obtained from the detail defect information record 352.

When being inputted by the operator, for example, with data such as inspection step name and product name and so on, the risk score calculation unit 33 (see FIG. 2) captures from the defect data memory unit 35 the corresponding defect data 350 and acquires a defect coordinate ($x_i$, $y_i$) from the corresponding detail defect information record 352. Subsequently, the risk score calculation unit 33 responds to the design data memory unit 32 to cut, out of design data of a circuit pattern of the wiring layer tied with inspection step name of an integrated circuit, pattern figure data confined in a rectangular area 43 of predetermined size which is centered on the defect. Illustrated in FIGS. 5A and 5B is an example of the pattern figure which is confined in the rectangular area 43 centered on the point P (X, Y) and which is defined by $X-2 \leq x \leq X+2$ and $Y-2 \leq y \leq Y+2$.

Subsequently, the risk score calculation unit 33 sets the hot spot ID to i and enters the defect coordinate ($x_i$, $y_i$) to the defect coordinate of detail defect information record 352 and stores the previously cut out pattern figure data to the design data ($CAD_i$) of hot spot information record 362 of the risk score data 360 (see FIG. 4).

Thereafter, the risk score calculation unit 33 counts the number of points where individual straight lines y=Y−2, Y−1, Y, Y+1 and Y+2 indicated at dotted line in the horizontal direction in FIG. 5B each intersect the boundary line of the wiring layer (hatched portions 41) confined in the rectangular area 43. In this example, the number of points is 2 for y=Y−2, 1 for y=Y−1, 2 for y=Y, 4 for y=Y+1 and 4 for y=Y+2, amounting up to 13 in total (Y total). Similarly, the risk score calculation unit 33 counts the number of points where straight lines x=X−2, X−1, X, X+1 and X+2 indicated at dotted line in the vertical direction in FIG. 5B each intersect the boundary line of the wiring layer (hatched portions 41) confined in the rectangular area 43, the count amounting up to 7 in total (X total) in the case of FIG. 5B. Then, the sum of the two totals, Xtotal+Ytotal=XYtotal is used herein as a pattern concentration.

As described above, according to the present embodiment, the pattern concentration is defined by the number of points where the straight lines drawn near a defect at intervals of predetermined distances in X and Y directions (in FIGS. 5A and 5B, mesh lines indicated at dashed line) interest the boundary line (edge line) of a pattern figure of the wiring layer.

Next, in the risk score calculation unit 33, the risk score ($r_i$) is defined by multiplying the pattern concentration (XY total) determined as above by a defect size ($s_i$) obtained from the defect data 350. More specifically, the risk score calculation unit 33 calculates a risk score ($r_i$) of each defect on the basis of a formula expressed by risk score ($r_i$)=defect size ($s_i$)× pattern concentration (XY total) and enters the thus calculated risk score (ri) to the risk score (ri) in hot spot information record 362 corresponding to i of the hot spot ID in risk score data 360.

In the description given of FIG. 5B, it is assumed that "1" indicative of the distance unit in X and Y directions, that is, the distance between adjacent mesh lines indicated at dashed line is a value which is, for example, ½ or less of the minimum wiring width or minimum wiring distance in the wiring layer. Further, in FIG. 5B, the rectangular area 43 in which the pattern figure of design data ($CAD_i$) is drawn is assumed to be an area satisfying X−2≦x≦X+2 and Y−2≦y≦Y+2 but in this case, the absolute value of "−2" and "+2" is not limited to "2". Similarly, the absolute value of "−2" and "+2" in the case of defining the range of the mesh lines for calculation of the pattern concentration is not limited to "2".

If a defect size ($s_x$, $s_y$) is given in the X and Y directions in order to deal with a defect of elongated shape, ($r_x$, $r_y$) calculated from $r_x = s_x \times Y$ total and $r_y = s_y \times X$ total may be defined as risk scores in the X and Y directions, respectively.

Reference will now be made to FIG. 6 to describe an example of display of defect data and risk score data. Illustrated in FIG. 6 is an example of a display screen showing a list of defect data and risk score data.

When the surface defect data display and management system 3 is turned on and display of a defect list is requested from a mouse or keyboard attached to the display apparatus 40 by designating product mane, inspection step name and wafer ID of a display target, the defect list display unit 37 displays a display screen 50 as shown in FIG. 6 on the display apparatus 40.

It is assumed that till then, defect data 350 as a result of a given wafer inspection or defect review has been acquired from the wafer inspection system 12 or review system 10 by means of the defect data acquisition unit 34 and has been stored in the defect data memory unit 35 and that risk score data 360 corresponding to the defect data 350 has been calculated by means of the risk score calculation unit 33 and stored in the risk score data memory unit 36. In other words, the defect list display unit 37 consults the defect data memory unit 35 and risk score data memory unit 36 to display the defect data 350 and the risk score data 360 stored in these memory units, respectively, on the display screen 50 in defect list format.

As shown in FIG. 6, in the defect list on display screen 50, columns are provided in which serial number 51, defect ID 52, wafer inspection image 53, review image 54, CAD data 55, defect category 56, defect size 57 and risk score 58 are displayed, respectively, in respect of individual defects.

In this defect list of on display screen 50, when an inspection target is inspected through a wafer inspection or defect review applied to the inspection target under a plurality of conditions and defects are detected under individual conditions, pieces of data of the physically same defect are displayed collectively in one row. As described previously, whether or not the defects are physically identical is decided by making a decision as to whether or not defect coordinates of the defects in the defect data 350 are identical.

In the defect list on the display screen 50, the defect ID 52 is divided into a plurality of sub-columns so that when the defect is detected through wafer inspection or defect review under a plurality of conditions, independent numbers or ID's may be entered to the sub-columns, respectively, in the course of execution of individual inspections or reviews. Then, in FIG. 6, defects determined as being physically identical are allotted with the same number in the column of serial number 51. Pieces of defect display data are thereafter managed on the basis of the serial number 51.

In the defect list on the display screen 50, the wafer inspection image 53 and review image 54 are image data obtained through wafer inspection or defect review under a plurality of conditions, and CAD data is design data pattern figure of near the defect coordinate of the defect. Then, the defect category 56 is classification data acquired through, for example, RDC or ADC and the defect size 57 is one of defect feature factors acquired through the ADR. The risk score 58 is a value calculated by the risk score calculation unit 33 in respect of the defect in question.

Typically, since the data of defect list as above cannot be displayed completely on one screen, scroll bars 61 in the vertical and horizontal directions are provided for the defect list on the display screen 50 and by using the scroll bars 61, the screen can be scrolled as necessary to display all pieces of defect data. When the column under the title of defect category is clicked, sorting is conducted in an ascending or descending fashion in respect of data in the titled column and pieces of data are displayed in order determined by sorting.

Only images acquired as defect images are displayed in the sub-columns of wafer inspection image 53 and review image 54. Likewise, for CAD data, only ones being present in the risk score data 360 are displayed.

On the left side of the defect list on the display screen 50, check boxes 59 for individually selecting defects are provided and at the right below corner on the display screen 50, "graph+image" button 62, "transmission" button 63 and "end" button 64 are provided. Then, when the "end" button 64 is clicked, the display screen 50 is closed and the process of displaying the defect list by means of the defect list display unit 37 in the surface defect data display and management system 3 ends.

When the operator enters a check mark (ν mark) to the check box 59 and clicks the "transmission" button 63, data such as defect coordinate of a defect to which the check mark is entered is transmitted to the review system 10 (in this case, SEM type review apparatus 14). Accordingly, by using the review system 10 to which the data of the defect selected by the check mark is transmitted, the operator can further perform detailed defect review efficiently.

When the operator clicks the "graph+image" button 62 on the display screen 50, a display screen 100 as shown in FIG. 7 is displayed on the display apparatus 40 through a process the correlation graph and defect image display unit 38 performs.

Referring now to FIG. 7, an example of the display screen is illustrated on which a correlation graph between the defect size and the risk score and besides an image of a defect selected through the correlation graph are displayed. In displaying the display screen 100, the correlation graph 101 between the defect size and the risk score is first displayed at the left half on the display screen 100. In the correlation graph 101, the relation between the risk score and the defect size in respect of the individual defects contained in the defect list on the display screen 50 is shown in the form of a so-called scatter plots. In the graph, abscissa represents the risk score, ordinate represents the defect size and one white circular dot 102 represents one defect. Conversely, for the coordinate axes of the correlation graph 101, ordinate may represent the risk score and abscissa may represent the defect size.

The operator can select one of white circular dots 102 shown in the correlation graph 101. When the operator selects one of the white circular dots 102 shown in the correlation graph 101, the selected white circular dot is inverted in color to black as indicated by a black circular dot 103 and then, in connection with the selected defect, pieces of data concerning serial number 104, risk score 105, wafer inspection image 106, review image 108, CAD data 107 and defect category 111 are displayed at the right half on the display screen 100.

The serial number 104, risk score 105 and defect category 111 each take the form of a text box and for one of the text boxes of serial number 104, the operator can change its value as desired. When the operator changes the value or entry in the text box of serial number 104, the black circular dot 103 in correlation graph 101 is exchanged with a defect corresponding to the changed serial number 104 and further, data pieces concerning the risk score 105, wafer inspection image 106, review image 108, CAD data 107 and defect category 111 are also changed to those of the defect corresponding to the changed serial number 104.

At the right below portion on the display screen 100, there are provided check boxes 109 and 110 for designating display mode such as "image list display" and "ADC teaching", respectively, and a "Back" button 112. With the "back" button 112 is clicked, the display screen 100 is closed, causing the display to return to the display screen 50 shown in FIG. 6.

Figure 8:
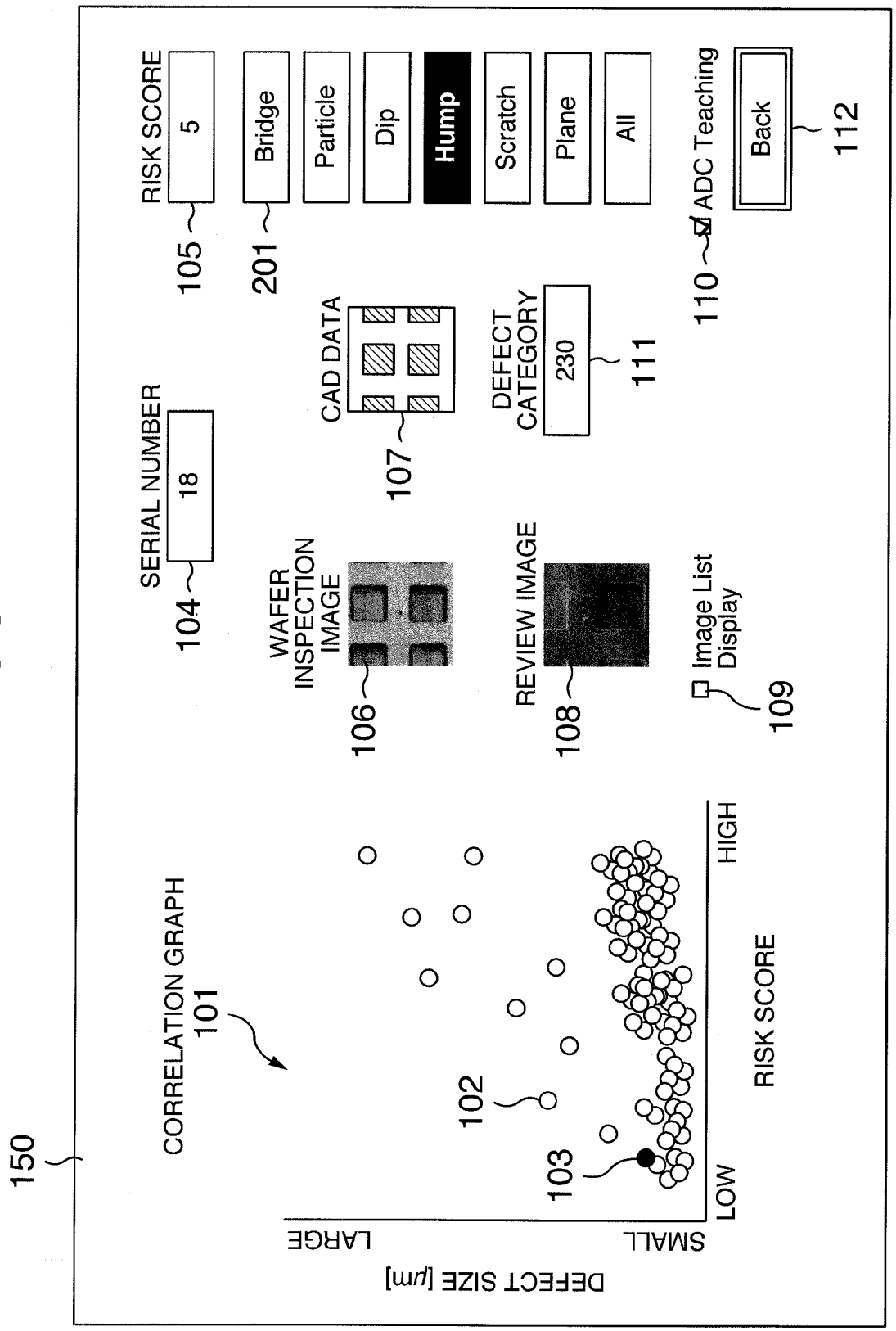
FIG. 8 is a diagram showing an example of a display screen on which defect classification buttons are additionally displayed on the display screen shown in FIG. 7.

When the operator enters the check mark to the check box 110 of "ADC Teaching", the display screen 100 switches to a display screen 150 as shown in FIG. 8.

Referring now to FIG. 8, an example of the display screen is illustrated on which defect classification buttons are added to the display screen 100 shown in FIG. 7. As shown in FIG. 8, a plurality of defect classification buttons 201 are displayed at a right edge portion on the display screen 150, in each of which a name of the corresponding defect classification is shown. The defect classification buttons correspond to the defect category 111, having their names "Bridge", "Particle", "Dip", "Hump", "Scratch" and "Plane" displayed but these names are not limitative.

In FIG. 8, of the defect classification buttons 201 displayed on the display screen 150, a defect classification button 201 having an entry of "Hump" is displayed in white to black inversion, indicating that a defect represented by a black circular dot 103 in the correlation graph 101 is sorted into "Hump". Accordingly, by displaying the display screen 150, the operator can easily know the defect classification of the defect selected through the use of the correlation graph 101.

In the event that when the operator being also an engineer of defect analysis watches the wafer inspection image 106, review image 108 and CAD data 107 and judging from the conditions of the defect, makes a decision that the entry to defect classification button 201 displayed in white to black inversion (that is, defect classification sorted according to ADC) is erroneous, the operator can change the data of defect classification. In that case, when the operator selects and drags any one of the wafer inspection image 106, review image 108 and CAD data 107, for example, and drops it at any one of defect classification buttons 201, the defect classification of the defect can be corrected through this operation.

Figure 9:
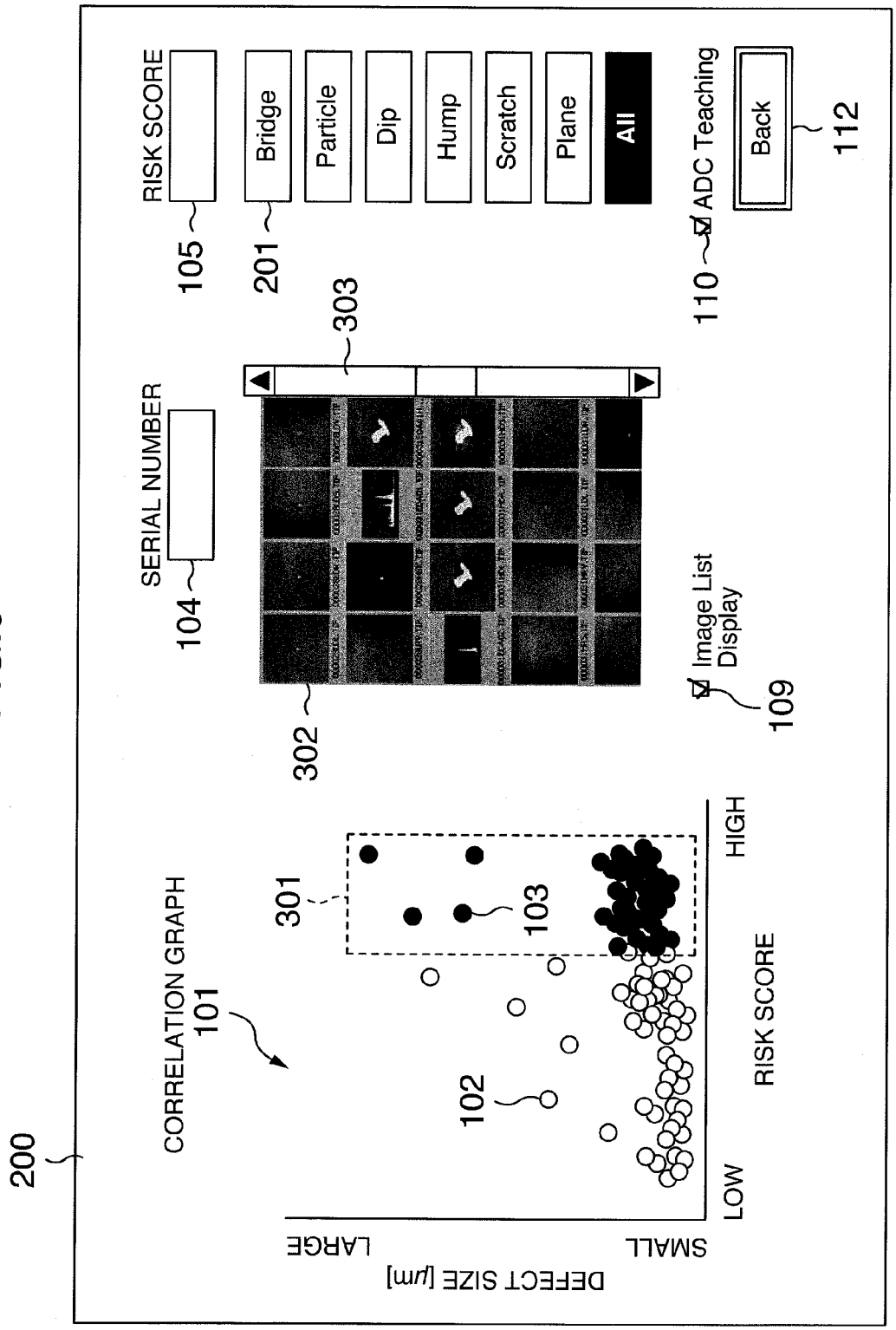
FIG. 9 is a diagram showing an example of a display screen when a plurality of defects are selected from the correlation graph and a list of images of the selected defects is displayed.

If, on the display screen 150, a plurality of white circular dots 102 shown in the correlation graph 101 are selected and the check mark is entered to the check box 109 of "Image List Display", the display screen 150 is switched to a display screen 200 as shown in FIG. 9.

Illustrated in FIG. 9 is an example of the display screen when the plural defects are selected from the correlation graph 101 and a list of images of the selected defects are displayed. For example, by designating an area 301 surrounded by dashed line in the correlation graph 101 on the display screen 200 as shown in FIG. 9, the operator can select plural defects corresponding to white circular dots 102 confined in the area 301. The thus selected defects are displayed in the form of black circular dots 103 in FIG. 9.

When in FIG. 9 the plural defects inside the area 301 are selected and the check mark is entered to the check box 109 of "Image List Display", an image list 302 is displayed in respect of the selected defects inside the area 301. In this case, since data of one specified defect is not displayed, the text boxes of serial number 104 and risk score 105 are blanked and "All" is selected and entered to the defect classification button 201 so as to be displayed in white to black inversion.

The image list 302 is attached with a scroll bar 303. Accordingly, even if the number of defect images to be displayed is too large to display them at a time, all images can be displayed through the scroll function based on the scroll bar 303.

Figure 10:
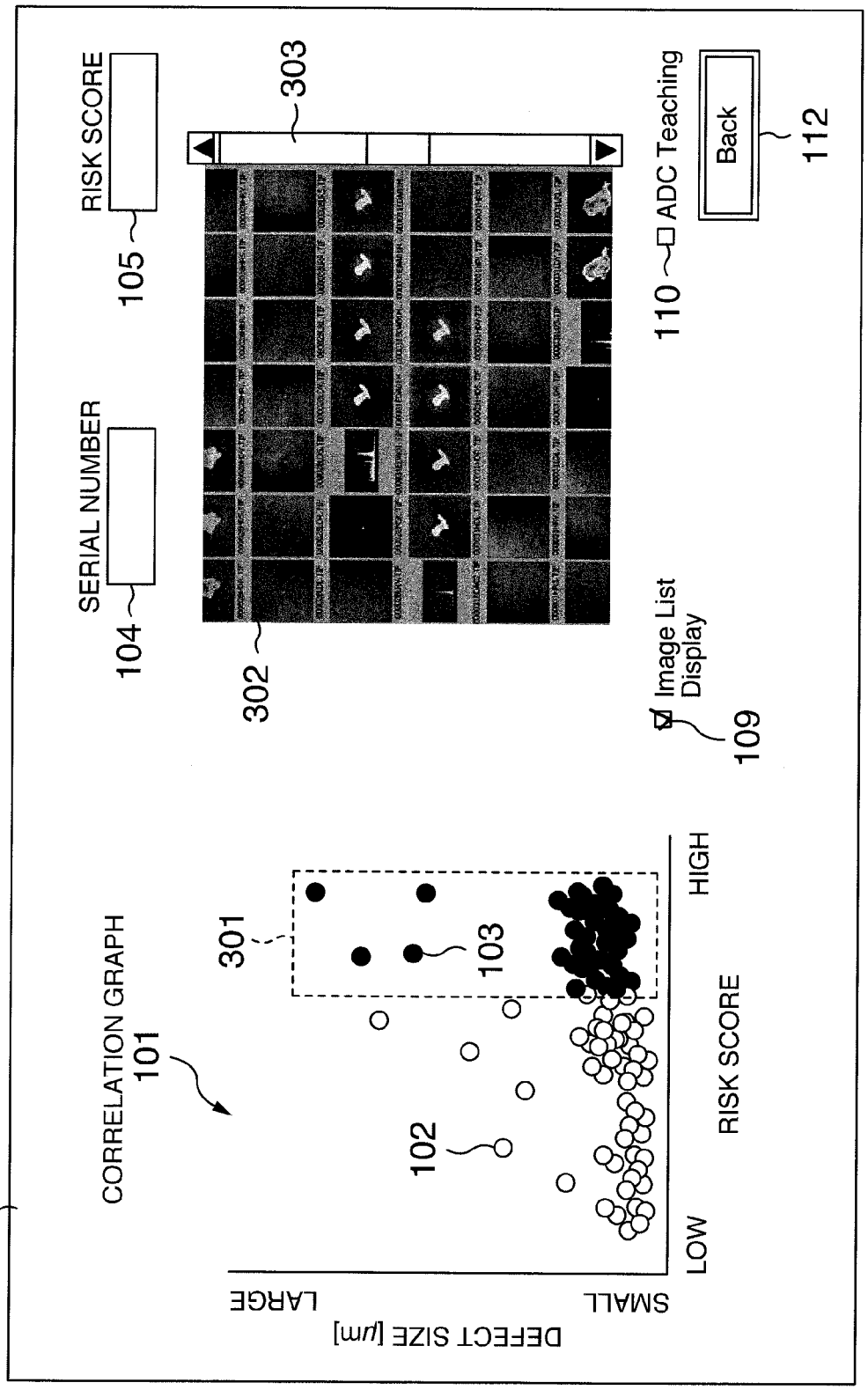
FIG. 10 is a diagram showing an example of a display screen when the display of defect classification buttons is closed in the display screen shown in FIG. 9.

When the check mark entered to the check box 110 of "ADC Teaching" is closed on the display screen 200, the display screen 200 is switched to a display screen 250 as shown in FIG. 10.

Illustrated in FIG. 10 is an example of the display screen when the display of defect classification button 201 is closed in the display screen 200 shown in FIG. 9. As shown in FIG. 10, in the display screen 250, the area for displaying the image list 302 is broadened. Therefore, images of a greater number of defects can be displayed at a time in the image list 302.

By utilizing the display screens 200 and 250 shown in FIGS. 9 and 10, the operator can select easily only defects of large risk scores, for example, and besides can take a look at a list of images of the selected defects. Accordingly, the operator can watch images of defects of large risk scores preferentially.

In displaying the image list 302, defects may not be selected with the help of the area 301 (see FIG. 9) in the correlation graph 101 but may be selected by means of the defect classification button 201. Illustrated in FIG. 11 is an example of the display screen when defects are selected by means of the defect classification button 201 and a list of images 302 of the selected defects are displayed on the display screen.

Figure 11:
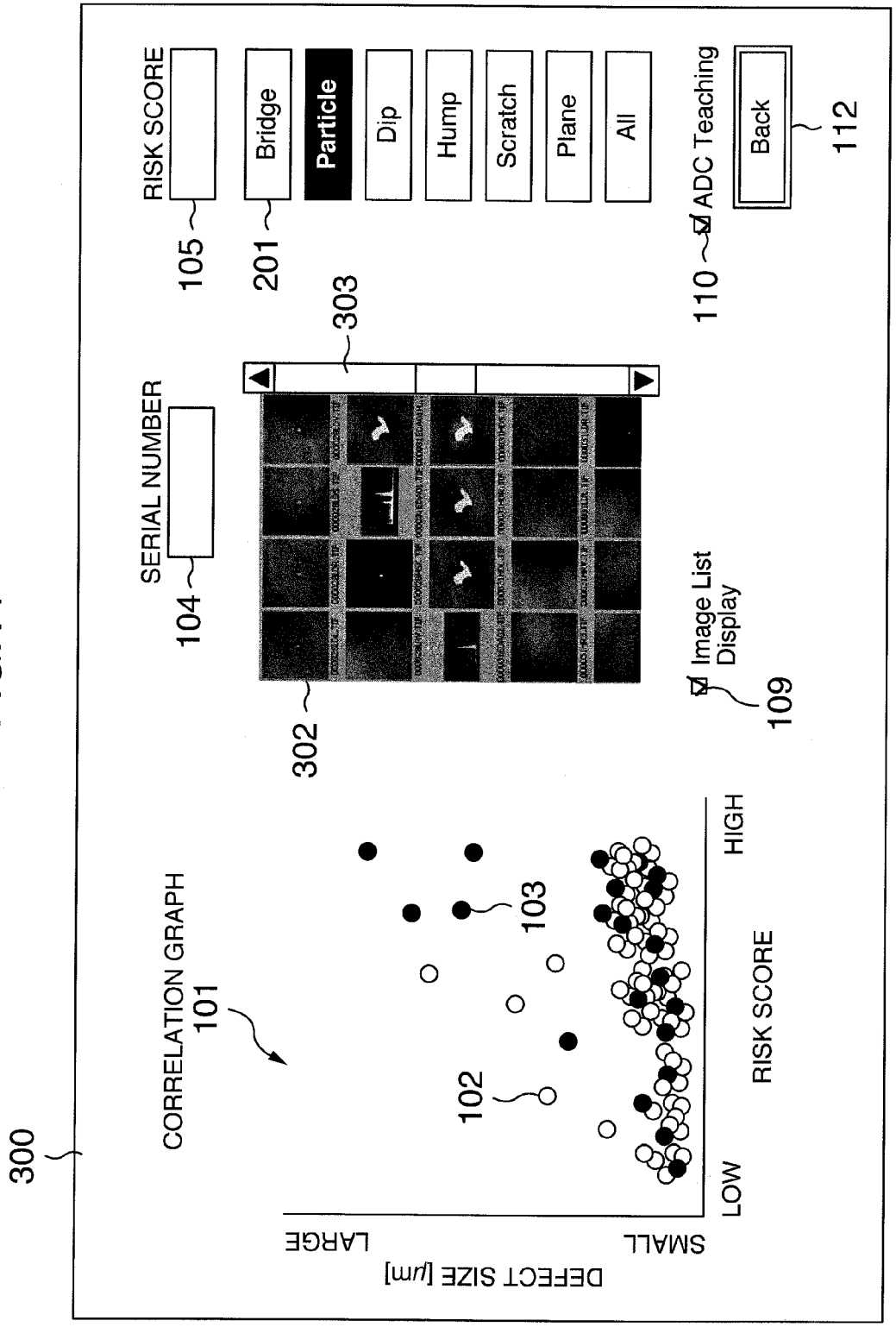
FIG. 11 is a diagram showing an example of a display screen when defects are selected by means of a defect classification button and a list of images of the selected defects is displayed.

In the FIG. 11 display screen 300, the defect classification button 201 is selected at "Particle". In this case, defects corresponding to "Particle" of defect classification (defect category) are displayed in the form of black circular dots 103 in the correlation graph 101 and the remaining defects are displayed in the form of white circular dots 102. In the image list 302, only the defects corresponding to "Particle" of defect classification are displayed.

Figure 12:
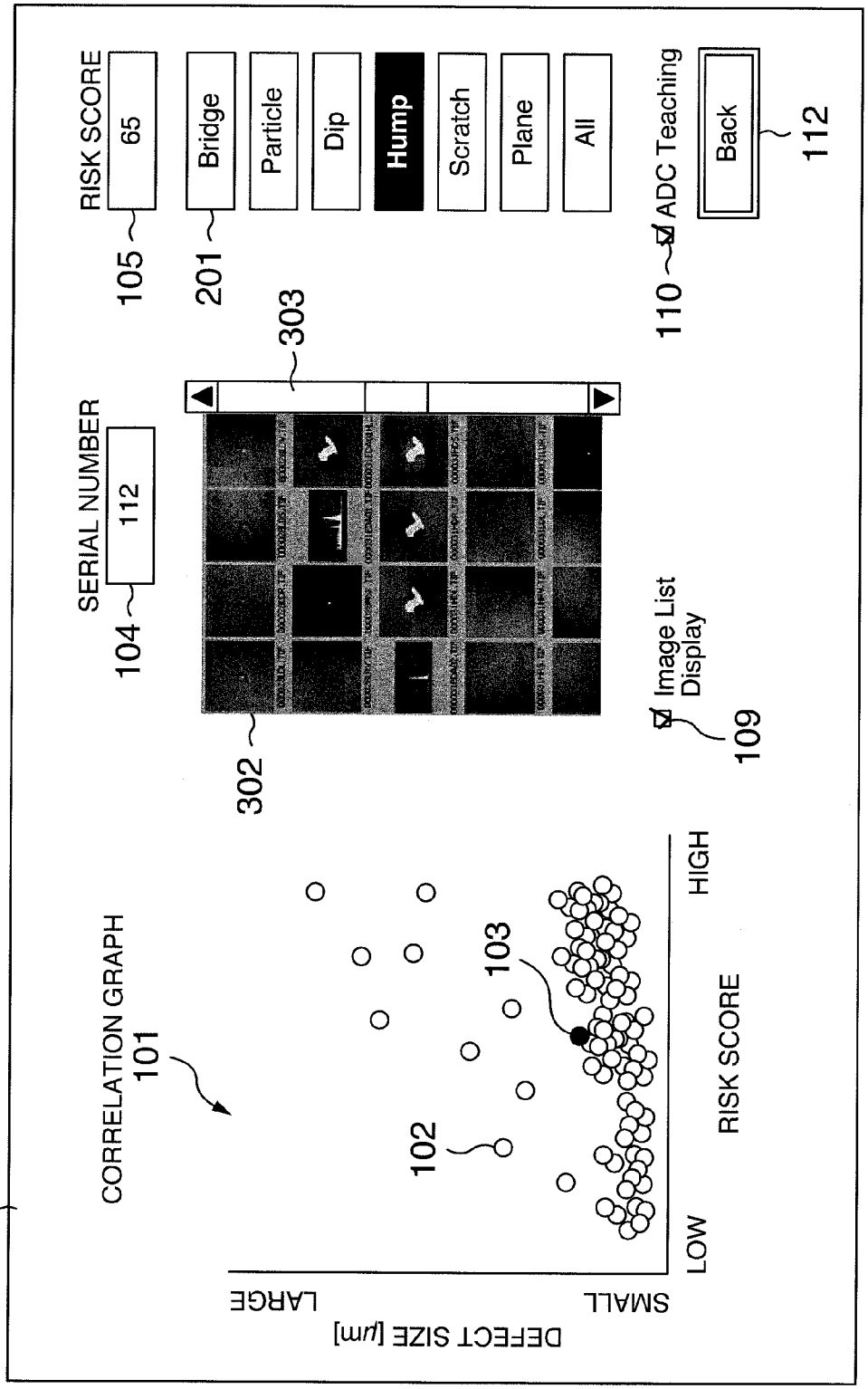
FIG. 12 is a diagram showing an example of a display screen with the image list displayed, when one of the defects is selected.

Further, when one of the black circular dots 103 in the correlation graph 101 is selected on, for example, the display screen 200 (see FIG. 9) or the display screen 300 (see FIG. 11) under the condition that the check marks are entered to both the check box 109 of "Image List Display" and the check box 110 of "ADC Teaching" and that the image list 302 is displayed, a display screen 340 as shown in FIG. 12 is displayed.

On the display screen 340, only one selected defect is indicated by a black circular dot 103 in the correlation graph 101 and an image of the selected defect is displayed in, for example, a highlight display fashion (displayed in the form of black thick frame in FIG. 12). Then, in the text boxes of serial number 104 and risk score 105, a serial number and a value of risk score of the thus selected defect are displayed and besides, in the defect classification button 201, a defect classification (defect category) of the defect in question is displayed in white to black inversion.

Assumptively, in this example, one black circular dot 103 in the correlation graph 103 is selected but one of images contained in the image list 302 may alternatively be selected. Further, the selected image in image list 302 is indicated in a highlight fashion but may alternatively be enlarged as in the case of the enlarged wafer inspection image 106 or review image 108 shown in FIG. 7.

When the operator determines that the defect classification displayed in white to black inversion in the defect classification button 201 is erroneous by watching the defect image displayed as explained above, the operator selects an image of the defect (for example, highlight image) from the image list 302 and drags the selected defect image to a proper defect classification button 201 and drops it thereat. Namely, through this operation, the operator can correct the defect classification sorted automatically by the function of, for example, ADC.

In the example of display screens 100, 150, 200, 250, 300 and 340 described previously, the correlation graph 101 indicates the correlation between the defect size and the risk score but provided that one of coordinate axes in the correlation graph 101 represents the risk score, the other coordinate axis may represent another feature factor (for example, the maximum gray level difference, see FIG. 3). Further, the employment of the correlation graph 101 as indicating the correlation with the risk score is not always necessary. Taking FIG. 13, for instance, an example of the display screen is illustrated on which a histogram of risk scores is displayed and a list of images of a plural defects selected from the histogram are displayed.

Figure 13:
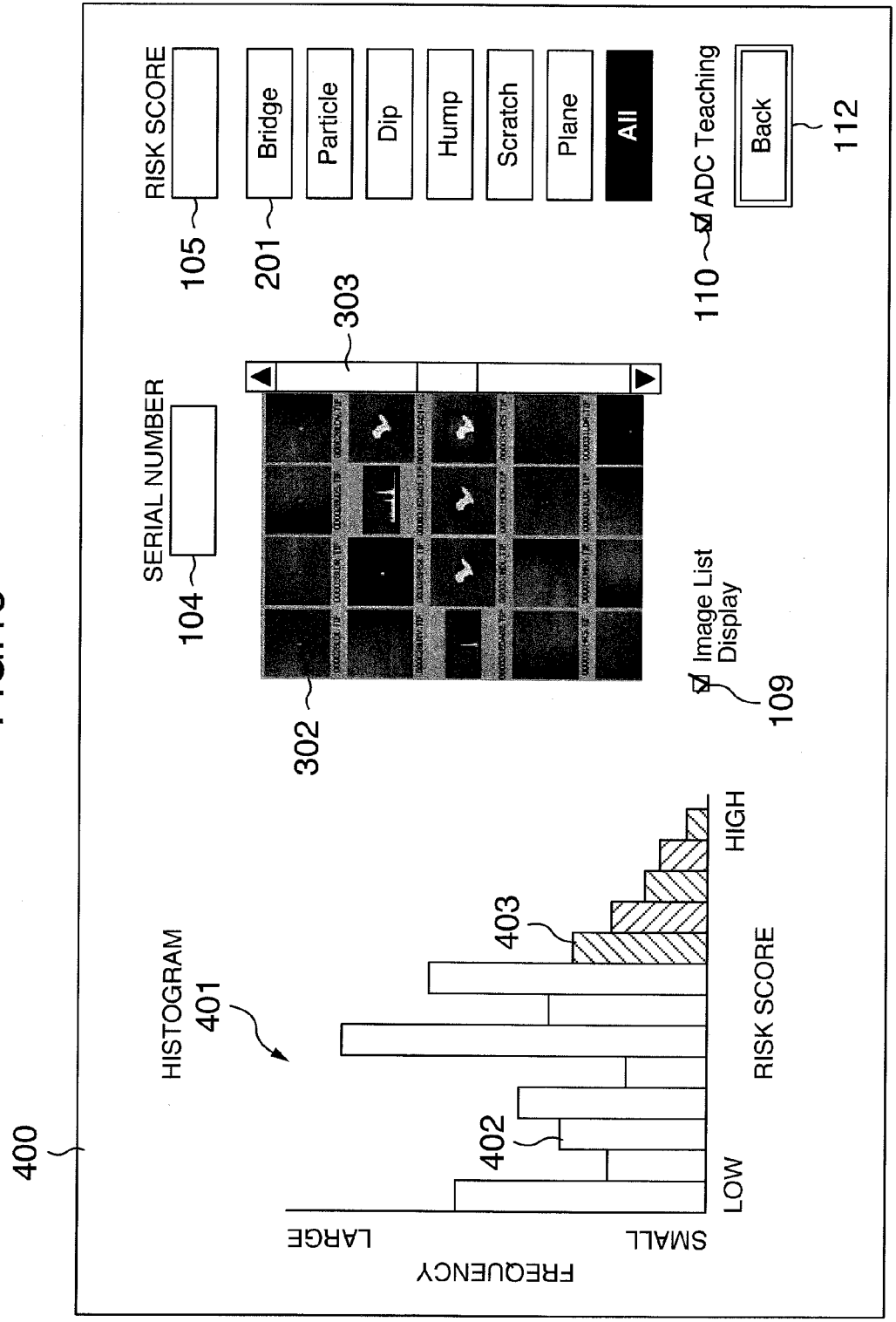
FIG. 13 is a diagram showing an example of a display screen on which a histogram of risk scores is displayed and a list of images of a plurality of defects selected through the histogram is displayed.

Referring to FIG. 13, a histogram 401 of risk scores is displayed at the left half on a display screen 400. The histogram 401 takes the form of a bar graph in which a blank bar 402 indicates "unselected" and a hatched bar 403 indicates "selected". Accordingly, the example of display screen 400 shows that defects having risk scores in excess of a given value are all selected. Then, images of the selected defects corresponding to the hatched bars 403 are displayed in an image list 302.

The display screens 100, 150, 200, 250, 300, 340 and 400 explained in connection with FIG. 7 and ensuring figures are displayed on the display apparatus 40 through a process executed by the correlation graph and defect image display unit 38 (see FIG. 2) in the data processing apparatus 30. Various processes of selecting defects by reading data the operator inputs by means of the keyboard or mouse through the medium of the display screens 100, 150, 200, 250, 300, 340 and 400 are executed by means of the defect selection unit 39 (see FIG. 2).

As has been set forth so far, according to the present embodiment, the operator being an engineer of defect analysis can select, as desired, defects in accordance with the magnitude of risk score by using the correlation graph 101 or histogram 401 displayed on the display apparatus 40 and can immediately watch an image of the selected defect. Accordingly, the operator can preferentially select a defect having a large risk score, that is, having a large degree of influence (impact) upon the production yield of products and can confirm an image of the defect. Therefore, the defect responsible for the major cause of a reduction in the yield can be analyzed preferentially and so the result of the defect analysis can be taken advantage of speedily in improving various production parameters in the production steps 11. As a result, the yield of products can be improved within a short period of time.

In the present embodiment, the target or objective for which the risk score of surface defect is calculated and surface defect data inclusive of the risk score is displayed has been described as being the wafer of silicon in the course of formation of the integrated circuit but the objective is in no way limited to the silicon wafer and may be a liquid crystal display substrate, an organic EL (Electro-Luminescence) display substrate, a magnetic disc substrate and so on.

To accomplish the object of the present invention described previously, a method of displaying and managing surface defect data according to the present invention is recited as follows:

a method of displaying and managing surface defect data in a surface defect data display and management system having a data processing apparatus, a storage and a display apparatus and adapted to display, on the display apparatus, surface defect data concerning a surface defect on a substrate detected by a surface defect inspection system for inspecting the surface defect on the substrate, wherein the storage includes a defect data memory unit for storing, as the surface defect data, data containing position, feature factor, defect classification name and defect image of the surface defect detected by the surface defect inspection system and a design data memory unit for storing design data representative of the shape of a pattern formed on the surface of the substrate, and wherein the data processing apparatus executes a method comprising the steps of:

(a) calculating, in respect of individual surface defects indicated by the surface defect data stored in the defect data memory unit, the magnitude of an influence the surface defect has upon a reduction in the yield of a final product manufactured from the substrate as a risk score of the surface defect on the basis of the feature factors and a pattern concentration obtained from design data of a pattern figure nearby a location corresponding to the position of the surface defect, (b) preparing, in respect of the surface defects indicated by the surface defect data stored in the defect data memory unit, a histogram of risk scores of the surface defects calculated by the risk score calculation unit and displaying the prepared histogram on the display apparatus, and (c) displaying on the display apparatus a list of defect images of one or more selected surface defects when one or more surface defects having risk scores within a predetermined range are selected on the basis of the displayed histogram.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A surface defect data display and management system having a data processing apparatus, a storage and a display apparatus and adapted to display, on the display apparatus, surface defect data concerning a surface defect on a substrate detected by a surface defect inspection system for inspecting the surface defect on the substrate, wherein said storage includes a defect data memory unit for storing, as the surface defect data, data containing position, feature factor, defect classification name and defect image of the surface defect detected by said surface defect inspection system, and a design data memory unit for storing design data representative of the shape of a pattern formed on the surface of said substrate, and wherein said data processing apparatus comprises:

a risk score calculation unit for calculating, in respect of individual surface defects indicated by the surface defect data stored in said defect data memory unit, the magnitude of an influence the surface defect has upon a reduction in the yield of a final product manufactured from the substrate as a risk score of the surface defect on the basis of the feature factors and a pattern concentration obtained from design data of a pattern figure nearby a location position corresponding to the position of the surface defect;

a correlation graph display unit for preparing, in respect of the surface defects indicated by said surface defect data stored in said defect data memory unit, a correlation graph showing the correlation between the feature factors and the calculated risk scores of the individual surface defects in the form of positions of dots and displaying the prepared correlation graph on said display apparatus;

a surface defect selection unit for selecting one or more surface defects on the basis of dots indicative of the surface defects shown in said correlation graph; and a surface defect image display unit for displaying in respect of one or more selected surface defects a list of surface defects on said display apparatus.

2. A surface defect data display and management system according to claim 1, wherein the feature factor of the surface defect is a defect size of the surface defect.

3. A surface defect data display and management system according to claim 1, wherein when the number of surface defects selected by said surface defect selection unit is one, said surface defect image display unit displays a defect image of said selected surface defect more largely than the defect image displayed in said list.

4. A surface defect data display and management system according to claim 1, wherein when the number of surface defects selected by said surface defect selection unit is one, said surface defect image display unit additionally displays a defect classification name of said selected surface defect on said display apparatus.

5. A surface defect data display and management system according to claim 1, wherein said surface defect image display unit additionally displays a list of defect classification names on said display apparatus and when receiving an input of a command to select one defect classification name from said list of defect classification names, displays dots representative of surface defects each having the selected defect classification name out of dots indicative of the surface defects shown in said correlation graph such that the dots to be displayed can be discriminated from the remaining dots and displays a list of defect images of said surface defects having said selected defect classification name on said display apparatus.

6. A surface defect data display and management system having a data processing apparatus, a storage and a display apparatus and adapted to display, on the display apparatus, surface defect data concerning a surface defect on a substrate detected by a surface defect inspection system for inspecting the surface defect on the substrate, wherein said storage includes a defect data memory unit for storing, as the surface defect data, data containing position, feature factor, defect classification name and defect image of the surface defect detected by said surface defect inspection system, and a design data memory unit for storing design data representative of the shape of a pattern formed on the surface of said substrate, and wherein said data processing apparatus comprises:

a risk score calculation unit for calculating, in respect of individual surface defects indicated by the surface defect data stored in said defect data memory unit, the magnitude of an influence the surface defect has upon a reduction in the yield of a final product manufactured from the substrate as a risk score of the surface defect on the basis of the feature factors and a pattern concentration obtained from design data of a pattern figure nearby a location corresponding to the position of the surface defect;

a histogram display unit for preparing, in respect of the surface defects indicated by said surface defect data stored in said defect data memory unit, a histogram of risk scores of said surface defects calculated by said risk score calculation unit and displaying the prepared histogram on said display apparatus;

a surface defect selection unit for selecting said surface defects by designating a range of the risk score on the basis of said displayed histogram; and a surface defect image display unit for displaying in respect of one or more selected surface defects a list of defect images on said display apparatus.

7. A method of displaying and managing surface defect data in a surface defect data display and management system having a data processing apparatus, a storage and a display apparatus and adapted to display, on the display apparatus, surface defect data concerning a surface defect on a substrate detected by a surface defect inspection system for inspecting the surface defect on the substrate, wherein said storage includes a defect data memory unit for storing, as the surface defect data, data containing position, feature factor, defect classification name and defect image of the surface defect detected by said surface defect inspection system and a design data memory unit for storing design data representative of the shape of a pattern formed on the surface of said substrate, and wherein said data processing apparatus executes a method comprising the steps of:

(a) calculating, in respect of individual surface defects indicated by the surface defect data stored in said defect data memory unit, the magnitude of an influence the surface defect has upon a reduction in the yield of a final product manufactured from said substrate as a risk score of the surface defect on the basis of the feature factors and a pattern concentration obtained from design data of a pattern figure nearby a location corresponding to the position of the surface defect, (b) preparing, in respect of the surface defects indicated by said surface defect data stored in said defect data memory unit, a correlation graph showing the correlation between the feature factors and the calculated risk scores of the individual surface defects in the form of positions of dots and displaying the prepared correlation graph on said display apparatus; and (c) displaying, when one or more surface defects are selected on the basis of dots indicative of the surface defects shown in said correlation graph, a list of defect images of said one or more selected surface defects on said display apparatus.

8. A method of displaying and managing surface defect data according to claim 7, wherein said feature factor of a surface defect is a defect size of the surface defect.

9. A method of displaying and managing surface defect data according to claim 7, wherein when the number of surface defects selected on the basis of dots indicative of surface defects shown in said correlation graph is one, said data processing apparatus displays a defect image of said selected surface defect more largely than the defect image displayed in said list.

10. A method of displaying and managing surface defect data according to claim 7, wherein when the number of surface defects selected on the basis of dots indicative of surface defects shown in said correlation graph is one, said data processing apparatus additionally displays a defect classification name of said selected surface defect on said display apparatus.

11. A method of displaying and managing surface defect data according to claim 7, wherein when displaying a list of defect images of the surface defects on said display apparatus, said data processing apparatus additionally displays a list of defect classification names and when receiving an input of a command to select one defect classification name from said displayed defect classification name list, displays dots indicative of surface defects each having the selected defect classification name out of dots indicative of the surface defects shown in said correlation graph such that the dots to be displayed can be discriminated from the remaining dots and displays a list of defect images of said surface defects having said selected defect classification name on said display apparatus.

* * * * *